(12) United States Patent
Sun et al.

(10) Patent No.: US 9,780,780 B2
(45) Date of Patent: Oct. 3, 2017

(54) INDUCTIVE SENSING SYSTEMS AND METHODS BASED ON MULTIPLE FREQUENCIES

(71) Applicant: ROCKWELL AUTOMATION TECHNOLOGIES, INC., Mayfield Heights, OH (US)

(72) Inventors: James Feng Sun, Andover, MA (US); Frederic Boutaud, Lexington, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 316 days.

(21) Appl. No.: 14/466,530

(22) Filed: Aug. 22, 2014

(65) Prior Publication Data

US 2016/0054153 A1 Feb. 25, 2016

(51) Int. Cl.
*G01D 5/20* (2006.01)
*H03K 17/95* (2006.01)

(52) U.S. Cl.
CPC ....... *H03K 17/9547* (2013.01); *G01D 5/2006* (2013.01); *H03K 2217/952* (2013.01)

(58) Field of Classification Search
CPC ............. G01D 5/2006; H03K 17/9547; H03K 17/945; H03K 17/9502; H03K 17/952; H03K 17/9537; H03K 17/954; G01B 7/02; G01B 7/023
See application file for complete search history.

(56) References Cited

U.S. PATENT DOCUMENTS

| 4,574,936 | A | * | 3/1986 | Klinger | G07D 5/08 194/318 |
| 5,072,180 | A | * | 12/1991 | Moreau | H03K 17/14 324/207.12 |
| 7,173,411 | B1 | * | 2/2007 | Pond | H03K 17/9547 324/207.12 |
| 8,779,783 | B1 | * | 7/2014 | Liepold | G06F 3/016 324/658 |
| 2009/0039873 | A1 | * | 2/2009 | Kirchdoerffer | G01D 5/2053 324/207.16 |
| 2009/0256715 | A1 | * | 10/2009 | Frederick | G08B 21/0213 340/686.6 |
| 2010/0060270 | A1 | * | 3/2010 | Gong | H03K 17/9502 324/207.16 |

(Continued)

*Primary Examiner* — Huy Q Phan
*Assistant Examiner* — David Frederiksen
(74) *Attorney, Agent, or Firm* — Fletcher Yoder P.C.

(57) ABSTRACT

A target detection system may include a power supply and an inductor capacitor (LC) tank circuit. The LC tank circuit may include a sensing coil, a first tank capacitor, and a second tank capacitor. Further, the LC tank circuit may alternate between the first tank capacitor and the second tank capacitor, and the power supply may power the LC tank circuit. The target detection system may further include measurement circuitry to measure a first decay characteristic of a first set of free oscillations from the first tank capacitor and a second decay characteristic of a second set of free oscillations from the second tank capacitor. Additionally, the target detection system may also include processing circuitry to compare the first decay characteristic to the second decay characteristic to determine a presence and a distance of a target.

17 Claims, 4 Drawing Sheets

(56) References Cited

U.S. PATENT DOCUMENTS

| | | | |
|---|---|---|---|
| 2011/0057668 A1* | 3/2011 | Chen | G01B 7/023 |
| | | | 324/655 |
| 2012/0242352 A1* | 9/2012 | Gong | H03K 17/9525 |
| | | | 324/656 |
| 2014/0159729 A1* | 6/2014 | Olsson | G01V 3/08 |
| | | | 324/326 |
| 2015/0008906 A1* | 1/2015 | Briefer | G01D 5/2013 |
| | | | 324/207.17 |
| 2015/0130445 A1* | 5/2015 | Widener | G01C 3/00 |
| | | | 324/207.17 |

* cited by examiner

INDUCTIVE SENSING SYSTEMS AND METHODS BASED ON MULTIPLE FREQUENCIES

BACKGROUND

The subject matter of the present disclosure relates generally to systems and methods for proximity sensors. In particular, the subject matter relates to inductive proximity sensor configurations for minimizing false readings and improving performance.

Conventional inductive proximity sensors are generally known for sensing the presence of targets of interest in a sensing region. Such devices typically include an LC tuned oscillator for producing an oscillating electromagnetic field around a sensing coil. The sensing coil may typically have a ferrite core, which may have a T-shaped or E-shaped cross section. The ferrite core may shape and extend the electromagnetic field surrounding the ferrite core in a sensing direction and/or concentrate or channel the electromagnetic field in other directions, such as behind and to the sides of the coil. A target which enters the sensing region of the proximity sensor may disrupt the electromagnetic field around the sensing coil with an eddy current and change the impedance of the coil sufficiently to alter the oscillating state of the LC oscillator. A proximity sensor may include an evaluator circuit having control circuitry for providing feedback indicative of the presence of a target of interest.

While advances have been made in the design of proximity sensors, such as to improve their sensing range and sensitivity, conventional proximity sensors may not perform consistently in certain applications. For example, inductive proximity sensors may often be used to detect the presence of different targets composed of various materials. However, different targets (e.g., ferrous targets and non-ferrous targets) typically have different effects on the impedance of the sensing coil, resulting in different sensing distance ratios for different materials (e.g., metals). Furthermore, inductive proximity sensors are often influenced by rapid changes in an environment surrounding the sensor (e.g., rapid temperature changes). Changes in the surrounding environment may influence the performance of the sensors, such as by changing a temperature of a single element of the sensor. For example, a face of the sensor may change temperatures before other elements of the sensor change. The resulting temperature difference may induce variations in the eddy currents that interact with the magnetic field of the sensing coil. As the face of the sensor is closer than a target of interest, the proximity sensor may sometimes return a fault trigger, where the face is sensed, rather than the target of interest. Thus, changes in the surrounding environment may induce false readings or false detections of targets. The subject matter of the present disclosure may limit effects of the environment on the sensor while detecting the target and improve sensing performance (e.g., provide an increased sensing range).

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter may encompass a variety of forms that may be similar to or different from the embodiments set forth below.

In a first embodiment, a target detection system may include a power supply. The target detection may also include an inductor capacitor (LC) tank circuit with a sensing coil, a first tank capacitor, and a second tank capacitor. Additionally, the LC tank circuit may alternate between the first tank capacitor and the second tank capacitor, and the power supply may provide a power source for the LC tank circuit. Further, the target detection system may include measurement circuitry to measure a first decay characteristic of a first set of free oscillations from the first tank capacitor and a second decay characteristic of a second set of free oscillations from the second tank capacitor. Furthermore, the target detection system may include processing circuitry to compare the first decay characteristic to the second decay characteristic to determine a presence and a distance of a target.

In a second embodiment, a method for detecting a target may include transmitting a high frequency signal and a low frequency signal toward a potential target location. The method may also include detecting a first decay characteristic of the high frequency signal and a second decay characteristic of the low frequency signal. Further, the method may include measuring the first decay characteristic and the second decay characteristic, comparing the first decay characteristic to the second decay characteristic, and detecting a presence of a target and a depth of a target based on a comparison of the first decay characteristic and the second decay characteristic.

In a third embodiment, a target detection system may include a power supply and driver circuitry. The power supply may provide a power source for the driver circuitry. Additionally, the target detection system may include a transmitter driven by the driver circuitry to transmit a first magnetic field at a first frequency and a second magnetic field at a second frequency. Further, the target detection system may include a first receiver and a second receiver. The first receiver may be configured to tune to the first magnetic field at the first frequency, and the second receiver may be configured to tune to the second magnetic field at the second frequency. Furthermore, the target detection system may include measurement circuitry to measure a first set of oscillation characteristics of the first receiver and a second set of oscillation characteristics of the second receiver, and the target detection system may include processing circuitry to compare the first set of oscillation characteristics to the second set of oscillation characteristics to determine a presence and a distance of a target.

DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Any examples of operating parameters and/or environmental conditions are not exclusive of other parameters/conditions of the disclosed embodiments.

Figure 1:
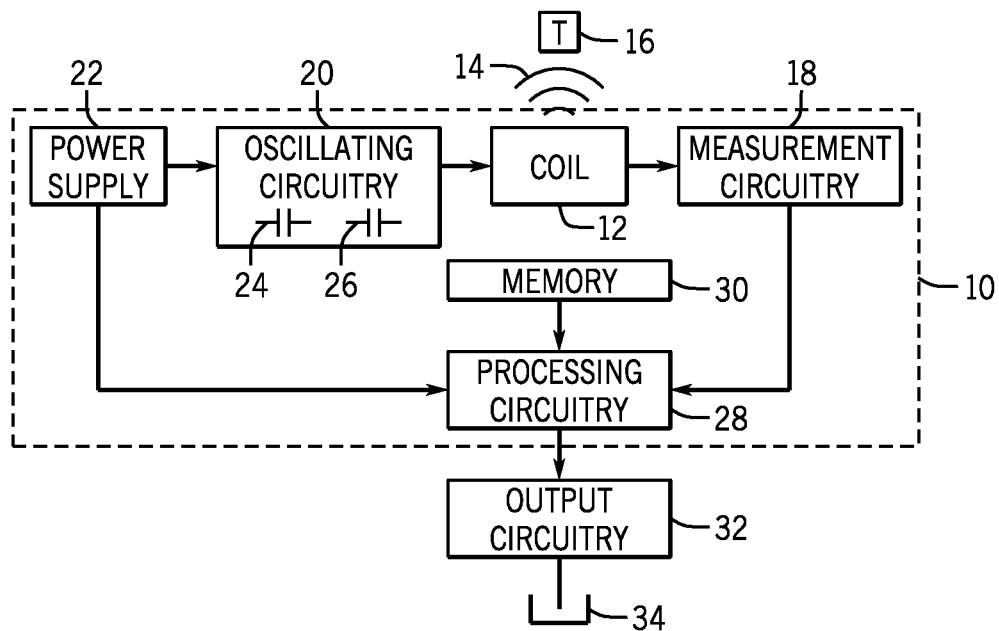
FIG. 1 is a schematic diagram of a proximity sensor, in accordance with an embodiment of the present techniques.

FIG. 1 is a schematic diagram of one embodiment of a proximity sensor 10. The proximity sensor 10 includes a sensing coil 12 that produces a magnetic field 14. Further, the sensing coil 12, while illustrated as a single coil in FIG. 1, may include multiple coils in other embodiments, as discussed in greater detail below. Upon approaching a target 16, the magnetic field 14 may induce eddy currents at the target 16. The magnetic field 14 may interact with the eddy currents from the target 16 resulting in a change in characteristics of the magnetic field 14 of the sensing coil 12 that were present prior to approaching the target 16. Additionally, measurement circuitry 18 measures the change in the characteristics of the magnetic field 14 to determine characteristics of the target 16 including the presence of the target 16, the distance of the target 16 from the proximity sensor 10, and a type of material of the target 16.

In the present embodiment, the proximity sensor 10 also includes oscillating circuitry 20 and a power supply 22. The power supply 22 supplies power to the oscillating circuitry 20 during operation of the proximity sensor 10. The power supply 22 may include a battery source, a grid source, or any other power source that may provide adequate power to the proximity sensor 10. Further, the oscillating circuitry 20 may include a low frequency tank capacitor 24, a high frequency tank capacitor 26, and a switching mechanism (not shown). The low frequency tank capacitor 24 may have a higher capacitance than the high frequency tank capacitor 26. Therefore, when the low frequency tank capacitor 24 is coupled to an inductor coil to form an inductor-capacitor (LC) tank circuit, a free oscillation created upon removing the power supply 22 may have a lower frequency (e.g., 10-20 kHz) than a higher frequency free oscillation (e.g., 50-100 kHz) created when coupling the high frequency tank capacitor 26 to the inductor coil to form the LC tank circuit. It may be appreciated that the oscillating circuitry 20 may also include multiple LC tank circuits. For example, the proximity sensor 10 may include multiple sensing coils 12 resulting in multiple LC tank circuits in the proximity sensor 10.

Additionally, the free oscillation created by the oscillating circuitry produces an oscillation within the magnetic field 14. While oscillating, the magnetic field 14 may decay faster than an expected decay of the free oscillation as the proximity sensor 10 approaches the target 16. The expedited decay may be a result of magnetic friction originating from the eddy currents produced at the target 16. To determine characteristics of the target 16, the measurement circuitry 18 may measure differences between the expected decay of the free oscillation and the observed decay of the free oscillation of the magnetic field 14.

The differences measured by the measurement circuitry 18 may subsequently be processed via processing circuitry 28 to break down the characteristics of the target 16. Once again, the power supply 22 provides a power source for operating the processing circuitry 28. Further, a memory 30 may provide instructions, analysis look-up tables, or any combination thereof to the processing circuitry 28 to process decay information gleaned by the measurement circuitry 18 into useable data.

Upon processing the decay information, the processing circuitry 28 provides the useable data to output circuitry 32 which may ultimately display the data on a graphical user interface (GUI) 34. The GUI 34 may display the data on any type of display device that a user may be inclined to use during a target proximity detection process. Further, the data may be displayed on the GUI 34 in such a manner that the data is easily read. For example, the GUI 34 may provide an indication of whether the target 16 is sensed, the type of material that the target comprises (e.g., ferrous or non-ferrous metal), and a proximity range of the target 16 to the proximity sensor 10.

Further, in the illustrated embodiment, the switching mechanism of the oscillating circuitry 20 may comprise a mechanical switch, a transistor switch, an electro-mechanical switch, or any combination thereof. The switching mechanism allows the oscillating circuitry 20 to repeatedly switch between an LC tank circuit configuration, which includes the low frequency tank capacitor 24, and an LC tank circuit configuration, which includes the high frequency tank capacitor 26. The switching mechanism may allow the low frequency configuration to freely oscillate for several oscillations before switching to the high frequency configuration. Once the switching mechanism switches to the high frequency configuration, the switching mechanism may again switch to the low frequency configuration after allowing the high frequency configuration to freely oscillate for several oscillations. This process may be repeated for as long as the proximity sensor 10 continues to run.

As the switching mechanism switches between the high frequency configuration and the low frequency configuration of the oscillating circuitry 20, the processing circuitry 28 may either receive data from the measurement circuitry 18 with a time stamp to determine the frequency configuration from which specific pieces of data originate, or the processing circuitry 28 may use instructions from the memory 30 to associate the data received by the processing circuitry 28 with the respective configuration of the oscillating circuitry 20.

In addition, the low and high frequency configurations of the oscillating circuitry 20 may play a role in determining whether a change in the oscillation decay is a result of the target 16 moving into an active field of the proximity sensor 10, or whether the change is a result of a variation of the near environment of the sensing coil 12. For example, a variation of the near environment of the sensing coil 12 could be a result of a face of the proximity sensor 10 changing temperature instead of the proximity sensor 10 detecting the target 16. To make this determination, multiple frequencies of the oscillations of the LC tank circuit may be measured. As discussed above, changing the capacitance of the capacitors 24, 26 creates multiple oscillation frequencies. Additionally, changing an inductance of the inductor coil (e.g., an inductance of the sensing coil 12) while maintaining the capacitance of the LC tank circuit also achieves the multiple frequencies. By changing the capacitance value, the inductance value, or both, the free oscillations may resonate at different frequencies, and the decay characteristics of the free oscillations may also be impacted differently when the target 16 is detected. For example, the magnetic friction and a damping factor of the free oscillations may vary as the frequency of the free oscillations varies.

Further, measuring the decay characteristics may be done in multiple ways. For example, the free oscillations may decay naturally and a decay constant may be measured based on signal waveforms of the decaying free oscillations. The decay constant measured in this embodiment may be a decay characteristic impacted by the target 16. Additionally, another method is to maintain the oscillation at a constant amplitude by injecting current into the LC tank circuit. The current injected into the LC tank circuit to compensate for the decay or losses of the oscillation may be measured and analyzed as an additional decay characteristic that is impacted by the target 16.

In another embodiment, as illustrated in FIG. 1, the measurement circuitry 18 may measure a low frequency free oscillation of the LC tank circuit and a high frequency free oscillation of the LC tank circuit. This technique may be effective when the target 16 is at a high distance (e.g., around 20 mm) because the magnetic field 14 pulsed at a low frequency may penetrate a front metal face of the target 16 more easily than the magnetic field 14 pulsed at a high frequency. This difference in penetration creates differences in how the free oscillations decay in the different frequency configurations of oscillating circuitry 20 due to the eddy currents originating from the target 16. Further, both the high frequency and the low frequency oscillations of the magnetic field 14 are similarly affected by characteristics (e.g., a temperature change) of a metal face situated near the sensing coil 12 (e.g., the face of the proximity sensor 10). Because of the differences in decay characteristics caused by the target 16 at a distance, information can be gathered as to what decay characteristics are caused by environmental conditions (e.g., temperature changes or deformation of the face of the proximity sensor 10) and not the actual target 16. In this manner, the proximity sensor 10 may reduce instances of false readings resulting from changing environmental conditions.

Figure 2:
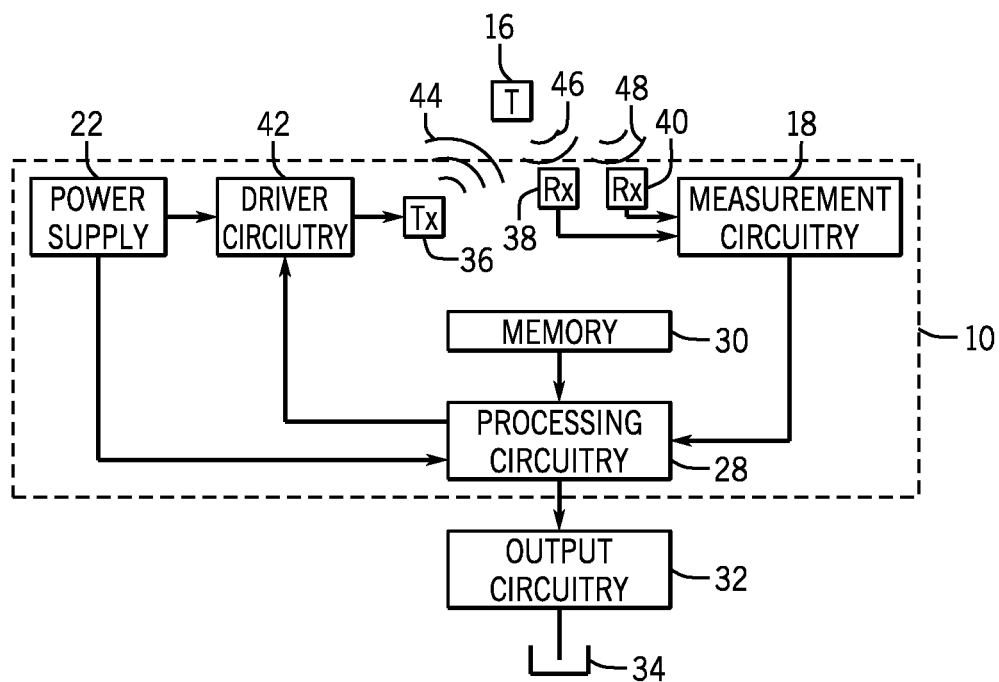
FIG. 2 is a schematic diagram of an arrangement of a proximity sensor including a transmitting device and two receiving devices, in accordance with an embodiment of the present techniques.

FIG. 2 is a schematic diagram of an arrangement of the proximity sensor 10 including a transmitting device 36 and two receiving devices 38, 40. In the arrangement illustrated in FIG. 2, driver circuitry 42 drives the transmitting device 36 to transmit an oscillating magnetic field 44 toward the target 16. Additionally, the power supply 22 provides a power source for the driver circuitry 42. The magnetic field 44 provided by the transmitting device 36 may vary in frequency oscillation. For example, the transmitting device 36 may oscillate the magnetic field 44 at a high frequency or a low frequency. It may be appreciated that the transmitting device 36 may be an LC tank circuit similar to the one discussed above in relation to FIG. 1. As discussed above, the high frequency and the low frequency magnetic fields 44 may interact with the target 16 and the face of the proximity sensor 10 in different manners. Measured differences between interactions of the high frequency and the low frequency magnetic fields 44 may enable a determination of the presence of the target 16 and the distance of the target 16 from the proximity sensor 10.

Additionally, the receiving devices 38, 40 may each be configured to detect the high frequency and the low frequency magnetic field 44 respectively. The receiving devices 38, 40 may include circuitry that tunes to the high and low frequencies. For example, the receiving devices 38, 40 may comprise magnetic field sensing coils with various inductance values to tune to a particular frequency.

Magnetic friction and eddy currents resulting from oscillation of the magnetic field 44 near the target 16 may interact with the magnetic field 44. Upon interaction, effects of the eddy currents and magnetic friction may alter the magnetic field 44 and result in a transformation from the magnetic field 44 to altered magnetic fields 46, 48. The altered magnetic field 46 represents the altered magnetic field for the low frequency magnetic field 44, and the altered magnetic field 48 represents the altered magnetic field for the high frequency magnetic field 44. The receiving devices 38, 40 receive the respective altered magnetic fields 46, 48 to which the receiving devices 38, 40 are tuned.

Upon receiving the magnetic fields at the receiving devices 38, 40, the measurement circuitry 18 measures the magnetic fields 46, 48 and supplies measurement data to the processing circuitry 28. The processing circuitry 28 may compare the measurement data from the magnetic fields 46, 48 with the high and low frequency magnetic fields 44 that are unaltered by the eddy currents of the target 16. The differences obtained between the various magnetic fields 44, 46, 48 may allow the processing circuitry to determine the presence and distance of the target 16. Upon a determination of the presence and distance of the target 16, the processing circuitry may provide an indication to the output circuitry 32 with corresponding presence and distance data. Further, similar to FIG. 1, the output circuitry 32 may output the presence and distance data to the GUI 34.

Additionally, in the illustrated embodiment, the processing circuitry 28 also controls the driver circuitry 42. The processing circuitry 28 may receive instructions from the memory 30 indicating a control process for the driver circuitry 42. The control process may call for the processing circuitry 28 to alternate between instructing the driver circuitry 42 to cause the transmitting device 36 to output the high frequency magnetic field 44 and to cause the transmitting device 36 to output the low frequency magnetic field 44. In this manner, the processing circuitry 28 may control timing of the transmitting device 36. It may also be worth noting that in the embodiment described above relating to FIG. 1, the processing circuitry 28 may be responsible for controlling the switching device in a similar manner to controlling the driver circuitry 42 in the present embodiment.

Figure 3:
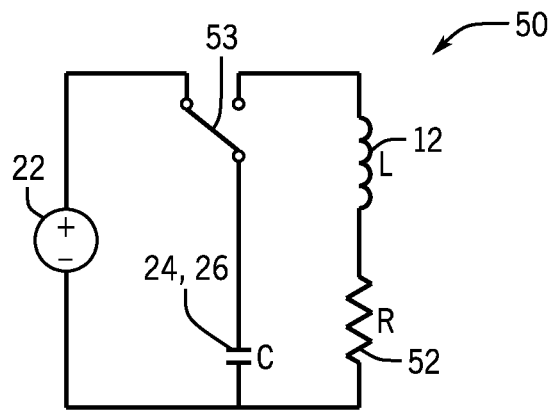
FIG. 3 is a circuit diagram of an inductor capacitor (LC) tank circuit, in accordance with an embodiment of the present techniques.

FIG. 3 is a circuit diagram of an inductor capacitor (LC) tank circuit 50. The LC tank circuit 50, as discussed above, provides the magnetic field 14 used to detect the target 16. The LC tank circuit 50 includes the sensing coil 12 (e.g., an inductor) and the low frequency tank capacitor 24 or the high frequency tank capacitor 26. Additionally, the LC tank circuit 50 may also include a resistor 52. The resistor 52 may be in the form of an actual resistor, a potentiometer, or the resistor 52 may represent a natural resistance that occurs in wiring and other components of the LC tank circuit 50. Further, the resistor 52 provides a damping effect on the oscillations of the LC tank circuit 50. Typically, a resistance of the resistor 52 may originate from internal resistances of various components in the system and not from a resistive device. Further, increased performance of the proximity sensor 10 may be achieved by limiting the resistance of the resistor 52 experienced at the LC tank circuit 50 to minimize damping when no target is present. For example, when the switch 53 switches from the power supply 22 to the sensing coil 12 and the resistor 52, the LC tank circuit 50, powered by the charged capacitor 24, 26, oscillates. This oscillation results in the sensing coil 12 generating the alternating magnetic field 14. The resistor 52 may provide the damping effect to the oscillation, ultimately stopping the oscillation over time. Absent the resistor 52 (i.e., in an ideal environment), the LC tank circuit 50 would continue to oscillate in perpetuity after the removal of the power supply 22.

With a known impact of the resistor 52 on the oscillation of the magnetic field 44, the processing circuitry 28 may examine any changes to the oscillation resulting from outside influence such as the eddy currents of the target 16. In this manner, differences in the oscillation of the magnetic field 44 may indicate characteristic changes of the target 16 such as the presence and the distance of the target 16 from the proximity sensor 10.

Further, as discussed above, the inductance of the sensing coil 12 and the capacitance of the capacitors 24, 26 influence the frequency of the oscillation. For example, the frequency of the oscillation may generally be determined by the equation:

$$\omega_0 = \frac{1}{\sqrt{LC}}.$$

Therefore, as the inductance or the capacitance increase, the frequency of the oscillation decreases. The opposite holds true for the inductance or the capacitance decreasing. As those values decrease, the frequency of the oscillation will increase. Therefore, to create a high frequency tank circuit, a lower inductance or capacitance value may be used, and to create a low frequency tank circuit, a higher inductance or capacitance value may be used. For example, in the illustrated embodiment of FIG. 1, the oscillating circuitry 20 switches between the low frequency tank capacitor 24 (i.e., a higher capacitance capacitor) and the high frequency tank capacitor 26 (i.e., a lower capacitance capacitor).

Figure 4:
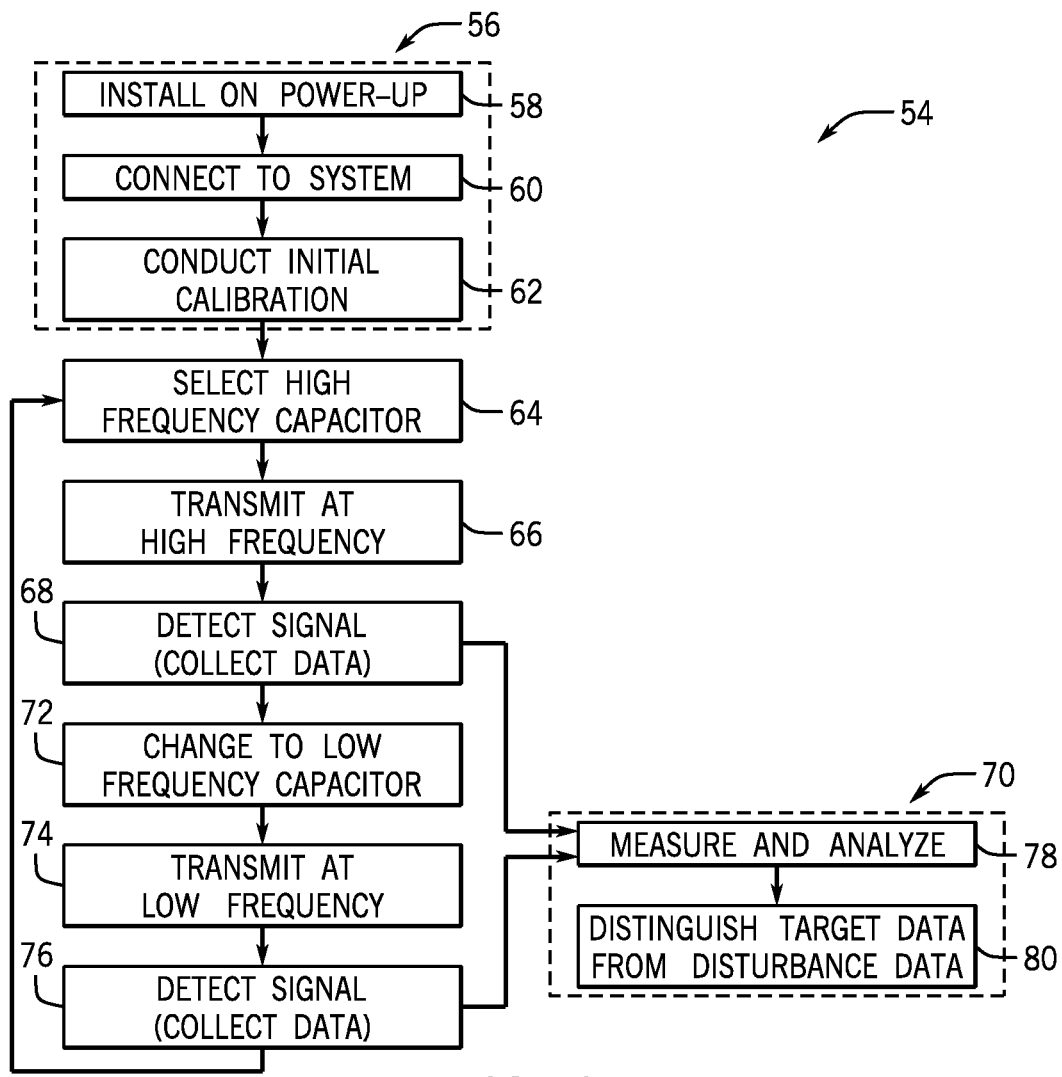
FIG. 4 is a flow diagram of a method for detecting a target with the proximity sensor of FIG. 1, in accordance with an embodiment of the present techniques.

FIG. 4 is a flow diagram of a method 54 for detecting the target 16 with the proximity sensor 10 illustrated in FIG. 1. The method 54 may begin with an initialization and calibration step 56. The initialization and calibration step 56 may involve installing a detection program at power-up of a proximity sensor system at block 58. Further, at block 60, the detection program may be connected to the proximity sensor system. Lastly, at block 62, the detection program and the proximity sensor system may conduct an initial calibration. The initial calibration may involve target detection of a known target at a known range from the proximity sensor 10. Additionally, the proximity sensor system may measure a baseline temperature of the sensing coil 12 to establish an equilibrium temperature and voltage measurement level. In this manner, the initial calibration may provide a reference point for the proximity sensor 10 to observe what effect occurs on the magnetic field 14 within a known proximity of the target 16.

Upon completion of the initialization and calibration step 56, the high frequency capacitor 26 may be selected at block 64 for the LC tank circuit 50 to produce the oscillating magnetic field 14. Selecting the high frequency capacitor 26 for the LC tank circuit 50 may be accomplished with an electronic switch, a mechanical switch, an electro-mechanical switch, or any other switching device capable of switching between the high frequency capacitor 26 and the low frequency capacitor 24.

Once the high frequency capacitor 26 is selected, the LC tank circuit 50 may remove the power supply 22 from the LC tank circuit 50 to transmit the oscillating magnetic field 14 that oscillates at a high frequency at block 66. The removal of the power supply 22 from the LC tank circuit 50 causes an amplitude of the oscillating magnetic field 14 to progressively decrease over time. As discussed above, the resistor 52 may provide the damping effect to drive the oscillation amplitude down over time.

After the oscillating magnetic field 14 has been transmitted for a pre-determined amount of time (e.g., 4 ms for a high frequency cycle and 8 ms for a low frequency cycle), an oscillating signal of the magnetic field 14 may be detected and oscillation data collected at block 68. The measurement circuitry 18 may observe and measure the oscillation damping of the magnetic field 14 transmitted at the high frequency. Further, after signal detection and data collection at block 68, the data may be provided at an analysis and distinction step 70, described in further detail below.

After the data is collected at block 68 for the high frequency oscillation of the magnetic field 14, the LC tank circuit 50 may change capacitance values to the low frequency capacitor 24 at block 72. As discussed above, changing to the low frequency capacitor 24 from the high frequency capacitor 26 may involve the switching mechanism switching between the high frequency configuration and the low frequency configuration of the LC tank circuit 50. When the high frequency capacitor 26 is not in use, the capacitor 26 may float as the switch is coupled to the low frequency capacitor 24. Similarly, when the low frequency capacitor 24 is not in use, the capacitor 24 may float as the switch is coupled to the high frequency capacitor 26.

When the low frequency capacitor 24 is selected, the LC tank circuit 50 may begin oscillating the magnetic field 14 at a lower frequency than the oscillation associated with the high frequency configuration of the LC tank circuit 50, which includes the high frequency capacitor 26. The low frequency oscillation may be damped by the resistor 52, and the low frequency oscillation may begin with a decaying amplitude upon the removal of the power supply 22.

Subsequently, at block 76, the oscillating signal of the magnetic field 14 may be detected and oscillation data collected for the pre-determined amount of time. As the oscillation data is collected, the oscillation data may be provided to the analysis and distinction step 70. Additionally, upon completion of the pre-determined amount of time in the low frequency configuration, the process may return to block 64 and a high frequency to low frequency loop (i.e., from block 64 to block 76) may be repeated until the proximity sensor 10 is powered down. In this manner, the proximity sensor 10 may continuously collect data to make a determination as to potential proximity characteristics of the target 16.

After each completion of the high frequency to low frequency loop from block 64 to block 76, the analysis and distinction step 70 may make the determination about the proximity characteristics of the target 16. The analysis and distinction step 70 may begin at block 78 when measuring and analyzing the oscillation data provided by blocks 68 and 76. As mentioned above, decay of the oscillating magnetic field 14 is influenced by the eddy currents induced by the target 16. By measuring a damping factor of the decay of the amplitude of the oscillation, information about the presence of the target 16 within proximity of the proximity sensor 10 may be determined. One method of measuring the decay is by integrating the positive half of a sine wave of the oscillation. For example, a decaying sine wave for the oscillation of the magnetic field 14 may be represented by Equation 1 below:

$$X(t) = A e^{-\alpha t} \sin(\omega t + \phi), \quad \text{(Equation 1)}$$

wherein A is the amplitude of the first sine period, $\phi$ is the phase offset, $f = 1/T = \omega/(2\pi)$ is the natural frequency of the oscillation, $\alpha = 2\pi k/T$ is the logarithmic decrement, and k is the exponential damping of the vibration signal. Integrating positive pulses of the equation above, a measurement of the logarathmic decrement $\alpha$ may be obtained. Further, integration of an nth pulse of the decaying sine wave may be represented by Equation 2 below:

$$Vn = A e^{-\alpha n T} \int_0^{T/2} e^{-\alpha t} \sin(\omega t + \phi) dt, \quad \text{(Equation 2)}$$

wherein n represents an nth pulse and T is a period of the sine wave. Therefore, for a series of M pulses of the oscillation, Equation 3 below may represent the integraton value of the positive pulses:

$$V_{NM} = A J \Sigma_{n=N}^{N+M} e^{-\alpha n T}, \quad \text{(Equation 3)}$$

wherein $J = \int_0^{T/2} e^{-\alpha t} \sin(\omega t) dt$. Integrating by parts J, we are left with Equation 4 below:

$$J = \frac{1}{1 + \frac{\alpha^2}{\omega^2}} \left(1 + e^{-\frac{\alpha \pi}{\omega}}\right), \quad \text{(Equation 4)}$$

and for the series LC tank circuit 50, $$\alpha = \frac{R}{2L} \text{ and } \omega = \frac{1}{\sqrt{LC}}.$$

Therefore, Equation 5 below represents J for the LC tank circuit 50:

$$J = \frac{\left(1 + e^{-\frac{\pi}{2} R \sqrt{\frac{C}{L}}}\right)}{1 + \frac{R^2 C}{4L}}, \quad \text{(Equation 5)}$$

and Equation 6 below represents the integration value $V_{NM}$ that may be measured by the measurement circuitry 18 to determine the potential proximity characteristics of the target 16:

$$V_{NM} = A \frac{\left(1 + e^{-\frac{\pi}{2} R \sqrt{\frac{C}{L}}}\right)}{1 + \frac{R^2 C}{4L}} \sum_{n=N}^{N+M} e^{-n\pi R \sqrt{\frac{C}{L}}}, \quad \text{(Equation 6)}$$

With the Equation 6 established for measuring the decay of the oscillation, it may also be beneficial to establish distinctions between changes due to a variation of an environment near the coil (e.g., a change of temperature of the face of the sensor) and a change of an environment far from the coil (e.g., the target 16 moving into an active field of the proximity sensor 10). This distinction may be accomplished at block 80 where the target data is distinguished from disturbance data. Further, the distinction may be accomplished by performing multiple measurements for different free oscillations of the LC tank circuit 50. For example, the LC tank circuit 50 may alternate between the high frequency configuration and the low frequency configuration. The measurement circuitry 18 may measure the oscillations, and the processing circuitry 28 may analyze the measurements to observe differing decay characteristics of the oscillations. The decay characteristics may vary based on magnetic friction and damping factors varying with oscillation frequencies.

Further, the target 16 may influence the oscillation decay differently depending on the distance of the target 16 from the proximity sensor 10. At a higher distance, the low frequency oscillation penetrates the face of the target 16 more easily than the high frequency oscillation. Because of the difference in penetration ease, a difference is created in characteristics of the oscillation and the oscillation decay. On the other hand, both the high and low frequency oscillations are impacted similarly by the metal face of an object near the coil (e.g., the face of the proximity sensor 10). Differences in how the metal faces influence the high and low frequency oscillations may provide information to distinguish target presence induced variations from local environment induced variations to the oscillations, as discussed in more detail below.

Figure 5:
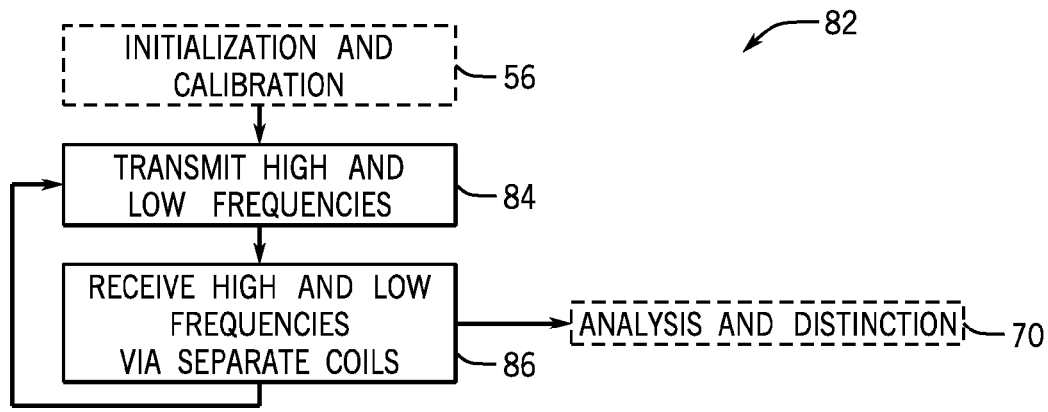
FIG. 5 is a flow diagram of a method for detecting a target with the proximity sensor of FIG. 2, in accordance with an embodiment of the present techniques.

FIG. 5 is a flow diagram of a method 82 for detecting the target 16 with the proximity sensor 10 illustrated in FIG. 2. The method 82 may begin with the initialization and calibration step 56, as discussed above in relation to FIG. 4. The initialization and calibration step 56 may enable loading of software used by the proximity sensor 10 and an initial calibration of the proximity sensor 10 to ensure accurate readings.

Upon completion of the initialization and calibration step 56, the high and low frequency oscillations of the magnetic field 44 may be transmitted at block 84. In contrast to the transmission of the magnetic field 14 in FIG. 1, the driver circuitry 42 may transmit either of the magnetic field frequencies in a continuously driven state, rather than a decaying free oscillation. Therefore, the LC tank circuit 50 alternating between the capacitors 24, 26 is not implemented. Instead, any system capable of providing a continuously oscillating magnetic field capable of switching between frequencies may be implemented as the driver circuitry 42 and the transmitting device 36.

Subsequently, at block 86, the receiving devices 38, 40 may receive the low and high frequency oscillating magnetic fields 46, 48. As discussed above, the receiving devices 38, 40 may include sensing coils that are individually tuned to either the low frequency oscillations or the high frequency oscillations. In this manner, the receiving devices 38, 40 may collect data on the low and high frequency magnetic fields 46, 48, respectively. After receiving a cycle of magnetic fields including transmitting the magnetic field 44 at both a high frequency and a low frequency, the cycle may restart at block 84 forming a continuous loop until a signal is received by the proximity sensor 10 to power off or perform some other function not included in the present subject matter. It may also be appreciated that while the high and low frequency magnetic fields 14, 44 are discussed presently as alternating between high and low frequency transmissions, in both the embodiment of FIG. 1 and the embodiment of FIG. 2, the high and low frequency magnetic fields 14, 44 may be transmitted simultaneously.

After receiving the low and high frequency magnetic fields 46, 48 at block 86, the data may be analyzed at the analysis and distinction step 70. The step may be accomplished in a similar manner to the analysis and distinction step 70 of method 54 discussed above except for the received oscillating magnetic fields 46, 48 are not decaying oscillations. Therefore, the received magnetic fields 46, 48 may be compared to the high and low frequency magnetic fields 44 expected to be transmitted by the transmitting device 36 (i.e., absent interaction with eddy currents from the target 16). Through this comparison, the processing circuitry 28 may determine the presence of the target 16. Further, the target 16 may influence the oscillations differently depending on the distance the target 16 is located from the proximity sensor 10 in a similar manner to the effect of the target 16 on the decay characteristics discussed above regarding the method 54. At a higher distance, the low frequency oscillation penetrates the face of the target 16 easier than the high frequency oscillation. Because of the difference in penetration ease, a difference is created in characteristics of the oscillation. On the other hand, both the high and low frequency oscillations are impacted similarly by the metal face of an object near the coil (e.g., the face of the proximity sensor 10). Differences in how the metal faces influence the high and low frequency oscillations may provide information to distinguish target presence induced variations from local environment induced variations to the oscillations.

Figure 6:
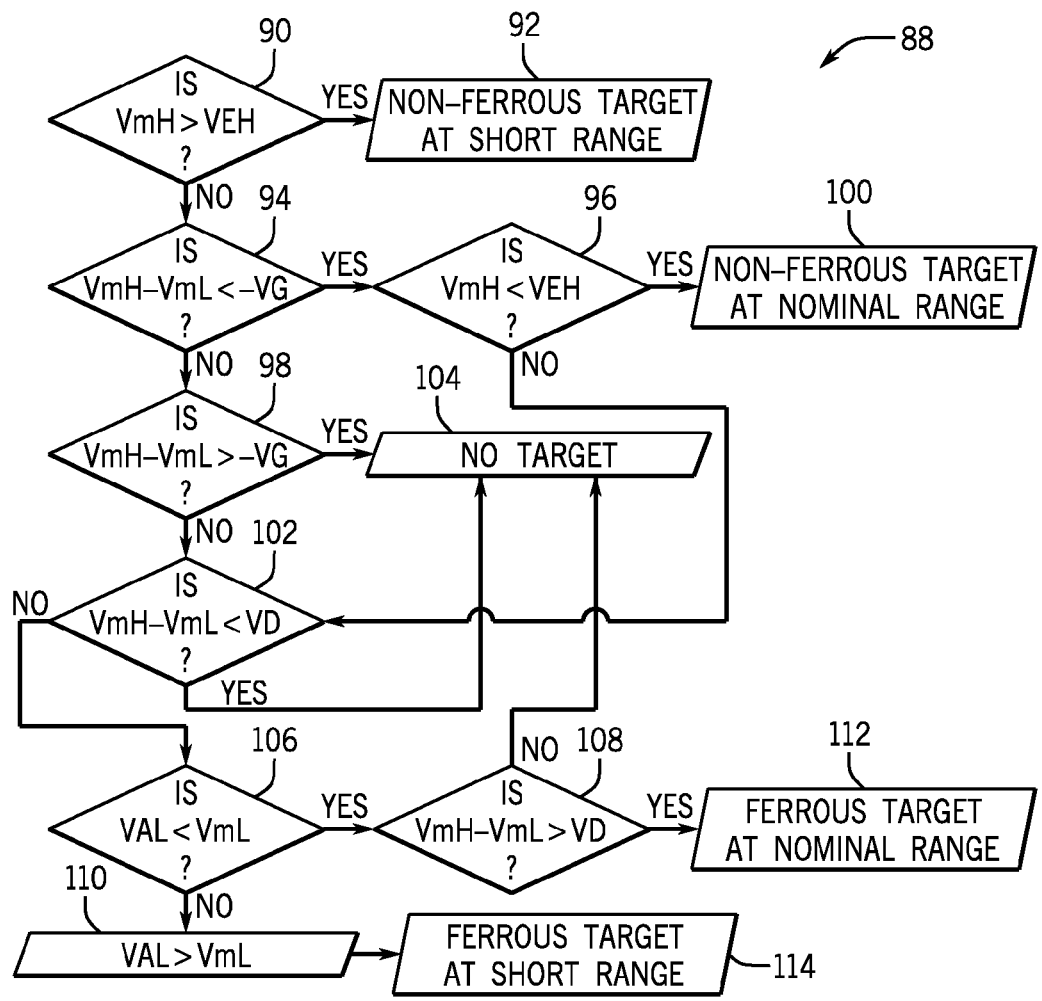
FIG. 6 is a flow diagram of a method of determining a presence of a target, in accordance with an embodiment of the present techniques.

FIG. 6 is a flow diagram of a method 88 of determining a presence of the target 16. The method 88 may represent a process that the processing circuitry 28 cycles through to determine the presence and a distance characteristic of the target 16. Additionally, the method 88 may enable distinction between the presence of the target 16, composition of the target 16, distance of the target 16 from the proximity sensor 10, and false detections resulting from environmental changes. The distance characteristic of the target 16 may include a distance the target 16 is from the proximity sensor 10 upon moving into the active field of the proximity sensor 10. Further, the method 88 may provide an indication of a type of metal (e.g., ferrous or non-ferrous metal) that makes up the target 16. Furthermore, false detections of the target 16 (e.g., indicating that the target 16 is sensed when the target 16 is not present) are avoided when using the method 88 because the magnetic fields 14, 44 of two different frequencies are observed and compared. For example, using the numbers of either one of the two frequencies of the magnetic fields 14, 44, a false detection may occur as both of the frequencies are detecting a change due to a decrease in temperature at the face of the proximity sensor 10. By comparing the two frequencies, as discussed below, the false detection may be avoided.

Initially, at block 90, a determination of whether a value of VmH, which represents characteristics of the oscillation decay for the high frequency magnetic field 14 as measured with Equation 6, is greater than a value of VEH, which represents a short range threshold voltage for the high frequency magnetic field 14. VEH and other threshold voltages discussed in detail below may be determined through calibration or testing prior to implementing the proximity sensor 10. If the determination is made that the value of VmH is greater than VEH, then, at block 92, an indication that a non-ferrous target is present at a short range (e.g., less than 10 mm from the proximity sensor 10) may be made to the output circuitry 32. On the other hand, if the value of VmH is less than the value of VEH, then the processing circuitry 28 may continue analyzing the data at block 94.

At block 94, a determination of whether a difference between the value of VmH and a value of VmL is less than a negative value of VG. In this instance, VmL represents characteristics of the oscillation decay for the low frequency magnetic field 14, and VG represents a threshold for a difference between a high frequency measurement and a low frequency measurement for a non-ferrous target at nominal range. Again, the value of VG may be determined through calibration or prior to implementing the proximity sensor 10. If the determination is that the difference between the value of VmH and the value of VmL is less than the negative value of VG, then a determination may be made by the processing circuitry 28 at block 96 as to whether VmH is less than VEH. Otherwise, a determination may be made at block 98 as to whether the difference between the value of VmH and VmL is greater than the negative value of VG.

In the determination at block 96, if VmH is less than VEH, then, at block 100, the processing circuitry 28 may provide a signal to the output circuitry 32 that there is a non-ferrous target at a nominal range (e.g., between 10 and 30 mm) from the proximity sensor 10. Additionally, if VmH is not less than VEH, then the processing circuitry 28 may continue to block 102 to make a determination as to whether the difference between the value of VmH and the value of VmL is less than a value of VD. VD, in the present embodiment, may represent a threshold value for the difference between the high frequency measurement and the low frequency measurement for a ferrous target at a nominal range.

As mentioned above, after determining at block 94 that the difference between the value of VmH and the value of VmL is not less than the negative value of VG, the determination may be made at block 98 as to whether the difference between the value of VmH and the value of VmL is greater than the negative value of VG. If the difference is greater than the negative value of VG, then the processing circuitry 28 may provide a signal to the output circuitry 32, at block 104, that there is no target present within the active field of the proximity sensor 10.

On the other hand, if the difference between the value of VmH and the value of VmL is not greater than the negative value of VG, the processing circuitry will continue to the determination at block 102 as to whether the difference between the value of VmH and the value of VmL is less than VD. If the difference is less than VD, then the processing circuitry 28 may provide a signal to the output circuitry 32, at block 104, that there is no target present within the active field of the proximity sensor 10. Otherwise, the processing circuitry may continue to block 106 to make a determination as to whether a value of VAL is less than the value of VmL.

At block 106, VAL may represent a threshold value for VmL to determine a ferrous target at a short range from the proximity sensor 10. Further, as with the other threshold values discussed above, the value of VAL may be established during calibration, or the value of VAL may be determined through testing prior to implementing the proximity sensor 10. Should the determination by the processing circuitry 28 indicate that VAL is less than the value of VmL, then the processing circuitry 28 may determine at block 108 whether the difference between VmH and VmL is greater than VD. Otherwise, if VAL is not less than the value of VmL, then the processing circuitry 28 may make a determination at block 110 that VAL is greater than the value of VmL.

As mentioned above, a determination may be made at block 108 as to whether the difference between VmH and VmL is greater than VD. If the difference is greater than VD, then the processing circuitry 28 may provide a signal to the output circuitry 32, at block 112, that a ferrous target is present at a nominal range. Otherwise, if the difference is not greater than VD, then the processing circuitry 28 may provide a signal to the output circuitry 32, at block 104, indicating that no target is present in the active field of the proximity sensor 10.

Finally, after determining at block 106 that VAL is not less than the value of VmL, a determination is made that VAL is greater than the value of VmL at block 110. Subsequently, the processing circuitry 28 may provide a signal to the output circuitry 32, at block 114, indicating that a ferrous target is present at a short range from the proximity sensor 10. After reaching block 114, the processing circuitry 28 may have exhausted all possibilities related to presence, location, and material of the target 16. At this point, or any other point in the method 88 where a target or no target determination and indication is made, the processing circuitry 28 may restart the method 88 at block 90 to determine if any changes to various properties of the target 16 have occurred.

Figure 7:
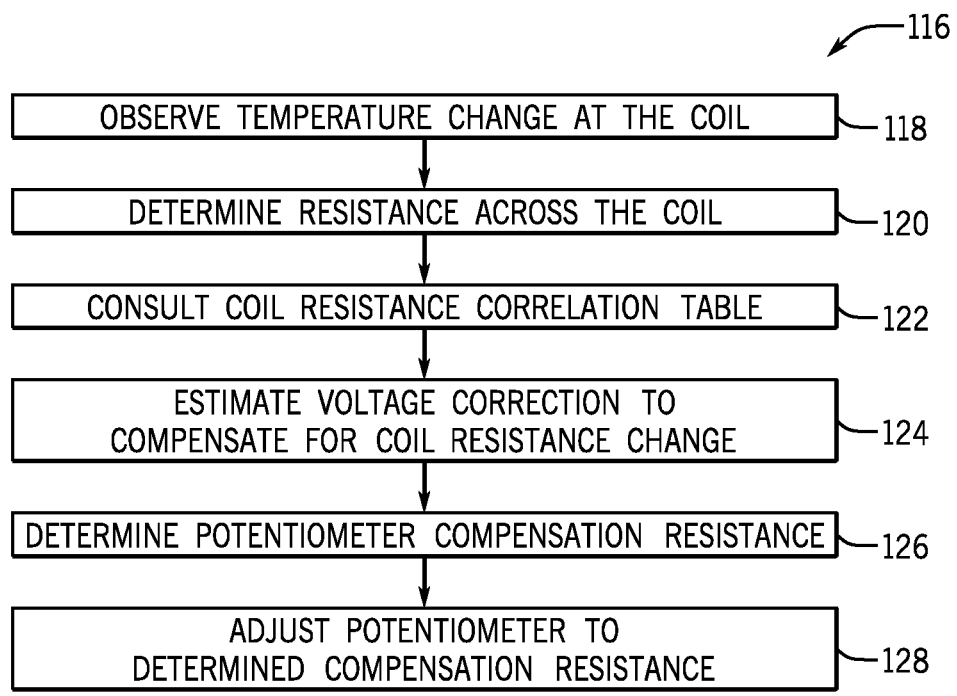
FIG. 7 is a flow diagram of a method for compensating for a temperature change at the proximity sensor of FIG. 1, in accordance with an embodiment of the present techniques.

FIG. 7 is a flow diagram of a method 116 for compensating for a temperature change at the proximity sensor 10. As mentioned above, several near environment factors may influence the oscillation decay and characteristics of the high frequency and low frequency configurations of the LC tank circuit 50. For example, deformations to the face (e.g., dents in the face) of the proximity sensor 10 may contribute to changes of the oscillation decay. Additionally, a rapid temperature change at the face of the proximity sensor 10 may also influence the oscillation decay. These changes in the oscillation decay may significantly change the values measured for VmL and VmH. Therefore, to maintain performance of the sensor across temperature and environmental changes, a precise temperature compensation method may be established to compensate for conditions that may alter measurements of the magnetic field 14, 44.

Initially, at block 118, the measurement circuitry 18 may observe a temperature change at the sensing coil 12. The temperature change at the sensing coil 12 may have a direct impact on the decay of the oscillations. For example, the change in temperature at the sensing coil 12 may also change the resistance of the sensing coil 12. Further, the impact on the decay may be especially prevalent at the low frequency configuration of the LC tank circuit 50 than at the high frequency configuration.

Subsequently, at block 120, the measurement circuitry may be configured to determine the resistance across the sensing coil 12. The resistance may be determined by any resistance measuring device (e.g., an ohmmeter) capable of measuring the resistance across the sensing coil 12. Further, the measured resistance of the sensing coil 12 may be measured over time as the temperature of the sensing coil 12 increases. Fitting a resulting curve with an exponential function may enable the measurement circuitry 18 to determine resistances across the sensing coil 12 at any time after the temperature of the sensing coil 12 begins to change. Further, in some instances, the resistance of the sensing coil 12 at a given temperature may be provided in a datasheet for the sensing coil 12. In this instance, the measurement circuitry 18 may measure the temperature of the sensing coil 12, and the processing circuitry 28, at block 122, may consult a coil temperature resistance correlation table stored in the memory 30. Therefore, the processing circuitry 28 may determine the resistance of the sensing coil 12 based on the temperature reading from the measurement circuitry 18.

Next, at block 124, the processing circuitry 28 may estimate a voltage correction value to compensate for the change in the resistance of the sensing coil 12. The voltage correction value may be calculated using a function of the coil resistance and its time derivative. For example, Equation 7, below, may represent a function of the coil resistance:

$$Vr = 982 - 138e^{\frac{-t}{54.3}}, \quad \text{(Equation 7)}$$

where Vr represents the resistance value as a function of time t. Using this equation and its time derivative, Equation 8, below, may represent the voltage compensation value:

$$\Delta VmL = [3.573 + 0.25 dVr][Vr - 844], \quad \text{(Equation 8)}$$

where ΔVmL is the voltage compensation. Using the voltage compensation from Equation 8, after a temperature change, the adjusted measured value may return to an equilibrium value with minimal deviation. A similar method may occur to compensate for the high frequency behavior, however, the high frequency behavior may be significantly less sensitive to the temperature variations of the sensing coil 12.

At block 126, a potentiometer may be used to provide compensation resistance for the coil resistance. As the resistance of the sensing coil 12 increases, a resistance of the potentiometer may decrease to compensate for that resistance. The amount that the potentiometer decreases may be calculated by reducing the resistance of the potentiometer to the amount that would provide appropriate voltage compensation, as determined by Equation 8. The processing circuitry 28 may accomplish this feat using Ohm's law to determine how much of a resistance drop may increase a gain of the LC tank circuit 50 to the compensation voltage value. After this calculation is completed, the potentiometer may be adjusted, at block 128, by an automated system within the proximity sensor 10 to the determined resistance level for the correct voltage compensation value. It may be appreciated that the method 116 may operate continuously for the duration of operation of the proximity sensor 10. Therefore, the automated system may constantly change the potentiometer setting to provide the correct voltage compensation to the LC tank circuit 50 as the temperature of the sensing coil 12 changes. It may also be appreciated that while the discussion above relates to a positive voltage compensation, in an instance where the voltage compensation is negative, the potentiometer resistance will increase to return the circuit to the equilibrium value.

While only certain features of the subject matter have been illustrated and described herein, many modifications and changes will occur to those skilled in the art. It is, therefore, to be understood that the appended claims are intended to cover all such modifications and changes as fall within the true spirit of the subject matter.

The invention claimed is:

1. A target detection system, comprising:
a power supply;
an inductor capacitor (LC) tank circuit comprising a sensing coil, a first tank capacitor enabling a first frequency free oscillation, and a second tank capacitor enabling a second frequency free oscillation different from the first frequency free oscillation, wherein the LC tank circuit alternates between connection of the same sensing coil to the first tank capacitor and to the second tank capacitor, and wherein the power supply provides a power source for the LC tank circuit;
measurement circuitry configured to measure a first decay characteristic of the first frequency free oscillation and the second frequency free oscillation; and
processing circuitry configured to compare the first decay characteristic to the second decay characteristic to determine a presence and a distance of a target;
wherein the measurement circuitry uses differences in the first frequency free oscillation and the second frequency free oscillation to create data that differentiates changes in the first decay characteristic and in the second decay characteristic as a result of environment changes from changes in the first decay characteristic and in the second decay characteristic as a result of target presence changes.

2. The target detection system of claim 1, wherein a first capacitance of the first tank capacitor is less than a second capacitance of the second tank capacitor.

3. The target detection system of claim 1, wherein the measurement circuitry measures the first decay characteristic and the second decay characteristic by integrating a positive half of a first decaying sine wave of the first set of free oscillations and a second decaying sine wave of the second set of free oscillations.

4. The target detection system of claim 1, comprising a potentiometer configured to compensate for a rapid temperature change of a detection environment.

5. The target detection system of claim 4, wherein the potentiometer is configured to change resistance values over time as the sensing coil changes temperatures.

6. The target detection system of claim 5, wherein the potentiometer resistance decreases to provide a positive voltage compensation and increases to provide a negative voltage compensation.

7. The target detection system of claim 1, wherein the measurement circuitry distinguishes between a ferrous target and a non-ferrous target.

8. A method for detecting a target, comprising:
transmitting a first frequency signal and a second frequency signal different from the first frequency signal toward a potential target location;
detecting a first decay characteristic of the first frequency signal and a second decay characteristic of the second frequency signal;
measuring the first decay characteristic and the second decay characteristic;
comparing the first decay characteristic to the second decay characteristic; and
detecting a presence of a target and a depth of a target based on a comparison of the first decay characteristic and the second decay characteristic;
wherein transmitting the first frequency signal and the second frequency signal comprises alternating between the first frequency signal and the second frequency signal by alternately coupling a first capacitor to a sensing coil and a second capacitor to the same sensing coil; and
wherein differences in the first frequency signal and the second frequency signal are used to create data that differentiates changes in the first decay characteristic and in the second decay characteristic as a result of environment changes from changes in the first decay characteristic and in the second decay characteristic as a result of target presence changes.

9. The method of claim 8, comprising detecting a rapid temperature change of a target detection environment; and adjusting a potentiometer to compensate for environmental changes affecting the first decay characteristic and the second decay characteristic.

10. The method of claim 8, comprising distinguishing target data from disturbance data related to environmental disturbances.

11. The method of claim 10, wherein the environmental disturbances comprise at least rapid changes in temperature.

12. The method of claim 8, comprising calibrating a detection device upon initiation based on initiation temperature readings at the detection device.

13. A target detection system, comprising:
a power supply;
driver circuitry configured to provide a power source based upon power from the power supply;
a transmitter configured to receive power from the driver circuitry and to transmit a first magnetic field at a first frequency and a second magnetic field at a second frequency, the transmitter comprising a first capacitor, a second capacitor, a coil, and a switch that alternatively couples the first capacitor to the coil and the second capacitor to the same coil to produce the first and second frequencies;
a first receiver and a second receiver, wherein the first receiver is configured to tune to the first magnetic field at the first frequency, and the second receiver is configured to tune to the second magnetic field at the second frequency;
measurement circuitry to measure a first set of oscillation characteristics of the first receiver and a second set of oscillation characteristics of the second receiver; and
processing circuitry to compare the first set of oscillation characteristics to the second set of oscillation characteristics to determine a presence and a distance of a target;
wherein the measurement circuitry uses differences in the first set of oscillation characteristics and the second set of oscillation characterisics to create data that differentiates changes in a first decay characteristic and in a second decay characteristic as a result of environment changes from changes in the first decay characteristic and in the second decay characteristic as a result of target presence changes.

14. The target detection system of claim 13, wherein the first frequency is higher than the second frequency.

15. The target detection system of claim 13, wherein the transmitter transmits the first signal and the second signal toward a target location at the same time.

16. The target detection system of claim 13, wherein the transmitter alternates between transmitting the first signal and the second signal.

17. The target detection system of claim 13, wherein the measurement circuitry is configured to distinguish between a ferrous target and a non-ferrous target.

* * * * *